United States Patent
Guo et al.

(10) Patent No.: US 11,476,359 B2
(45) Date of Patent: Oct. 18, 2022

(54) STRUCTURES FOR REDUCING ELECTRON CONCENTRATION AND PROCESS FOR REDUCING ELECTRON CONCENTRATION

(71) Applicant: WOLFSPEED, INC., Durham, NC (US)

(72) Inventors: Jia Guo, Durham, NC (US); Scott Sheppard, Durham, NC (US); Saptharishi Sriram, Durham, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 16/356,234

(22) Filed: Mar. 18, 2019

(65) Prior Publication Data
US 2020/0303533 A1    Sep. 24, 2020

(51) Int. Cl.
| | | |
|---|---|---|
| H01L 31/072 | (2012.01) | |
| H01L 29/778 | (2006.01) | |
| H01L 29/06 | (2006.01) | |
| H01L 29/66 | (2006.01) | |

(52) U.S. Cl.
CPC ...... H01L 29/7786 (2013.01); H01L 29/0607 (2013.01); H01L 29/66462 (2013.01)

(58) Field of Classification Search
CPC ............ H01L 29/0607; H01L 29/7786; H01L 29/66462
See application file for complete search history.

(56) References Cited

U.S. PATENT DOCUMENTS

| | | | |
|---|---|---|---|
| 6,548,333 B2 | 4/2003 | Smith | |
| 2009/0212325 A1* | 8/2009 | Sato | H01L 29/1066 257/192 |
| 2010/0025730 A1* | 2/2010 | Heikman | H01L 29/7787 257/E21.403 |
| 2012/0112202 A1* | 5/2012 | Hwang | H01L 29/66462 257/E21.403 |
| 2013/0020584 A1* | 1/2013 | Oishi | H01L 29/1029 257/76 |
| 2014/0329367 A1* | 11/2014 | Sheppard | H01L 29/778 438/285 |

OTHER PUBLICATIONS

International Search Report and Written Opinion for PCT/US20/22681, dated Jun. 15, 2020.
International Patent Application No. PCT/US2020/022681; Int'l Preliminary Report on Patentability; dated Sep. 30, 2021; 7 pages.

* cited by examiner

*Primary Examiner* — Samuel A Gebremariam
(74) *Attorney, Agent, or Firm* — BakerHostetler

(57) ABSTRACT

A device includes a substrate; a buffer layer on the substrate; a barrier layer on the buffer layer, a source electrically coupled to the barrier layer; a gate electrically coupled to the barrier layer; and a drain electrically coupled to the barrier layer. The device further includes an electron concentration reduction structure arranged with at least one of the following: in the barrier layer and on the barrier layer. The electron concentration reduction structure is configured to at least one of the following: reduce electron concentration around the gate, reduce electron concentration around an edge of the gate, reduce electron concentration, increase power gain, increase efficiency, decouple the gate from the drain, decouple the gate from the source, and reduce capacitance.

20 Claims, 11 Drawing Sheets

STRUCTURES FOR REDUCING ELECTRON CONCENTRATION AND PROCESS FOR REDUCING ELECTRON CONCENTRATION

FIELD OF THE DISCLOSURE

The disclosure relates to transistors having structures for reducing gate adjacent electron concentration for increasing power gain and efficiency. The disclosure also relates to a process for reducing gate adjacent electron concentration for increasing power gain and efficiency in transistors.

BACKGROUND OF THE DISCLOSURE

Group III-nitride based high-electron mobility transistors (HEMTs) are very promising candidates for high power amplifiers, radiofrequency (RF) applications, and also for low frequency high power switching applications since the material properties of Group III-nitrides, such as gallium nitride (GaN) and its alloys enable achievement of high voltage and high current along with high RF gain and linearity for RF applications. A typical Group III-nitride HEMT comprises a substrate, a Group III-nitride (e.g., GaN) buffer or channel layer formed on the substrate, and a higher band-gap Group III-nitride (e.g., AlGaN) formed on the buffer or channel layer. Respective source, drain and gate contacts are electrically coupled to the barrier layer. The HEMT relies on a two-dimensional electron gas (2DEG) formed at the interface between the higher band-gap barrier layer and the lower bandgap buffer or channel layer, where the lower bandgap material has a higher electron affinity. The 2DEG is an accumulation layer in the lower bandgap material and can contain a high electron concentration and high electron mobility.

HEMTs fabricated in the Group III-nitride material system have the potential to generate large amounts of RF power because of the combination of material characteristics that includes high breakdown fields, wide bandgaps, large conduction band offset, and/or high saturated electron drift velocity. However, Group III-nitride HEMTs can be limited by a high gate drain capacitance, a high gate source capacitance, and/or other capacitances induced by the high electron concentration around the gate.

Accordingly, there is a need for addressing high gate drain capacitance, high gate source capacitance, and/or other capacitances induced by the high electron concentration around the gate.

SUMMARY OF THE DISCLOSURE

One general aspect includes a device including: a substrate. The device also includes a buffer layer on the substrate. The device also includes a barrier layer on the buffer layer. The device also includes a source electrically coupled to the barrier layer. The device also includes a gate electrically coupled to the barrier layer. The device also includes a drain electrically coupled to the barrier layer; and an electron concentration reduction structure arranged with at least one of the following: in the barrier layer and on the barrier layer, where the electron concentration reduction structure is configured to at least one of the following: reduce electron concentration around the gate, reduce electron concentration around an edge of the gate, reduce electron concentration, such as between the gate and the drain and/or between the gate and the source, increase power gain, increase efficiency, decouple the gate from the drain, decouple the gate from the source, and reduce capacitance, such as the capacitance between the gate and the drain and/or between the gate and the source.

One general aspect includes a process of forming a device including: providing a substrate. The process also includes arranging a buffer layer on the substrate. The process also includes arranging a barrier layer on the buffer layer. The process also includes electrically coupling a source to the barrier layer. The process also includes electrically coupling a gate to the barrier layer. The process also includes electrically coupling a drain to the barrier layer; and forming an electron concentration reduction structure with at least one of the following: in the barrier layer and on the barrier layer, where the electron concentration reduction structure is configured to at least one of the following: reduce electron concentration around the gate, reduce electron concentration around an edge of the gate, reduce electron concentration, such as between the gate and the drain and/or between the gate and the source, increase power gain, increase efficiency, decouple the gate from the drain, decouple the gate from the source, and reduce capacitance, such as the capacitance between the gate and the drain and/or between the gate and the source.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
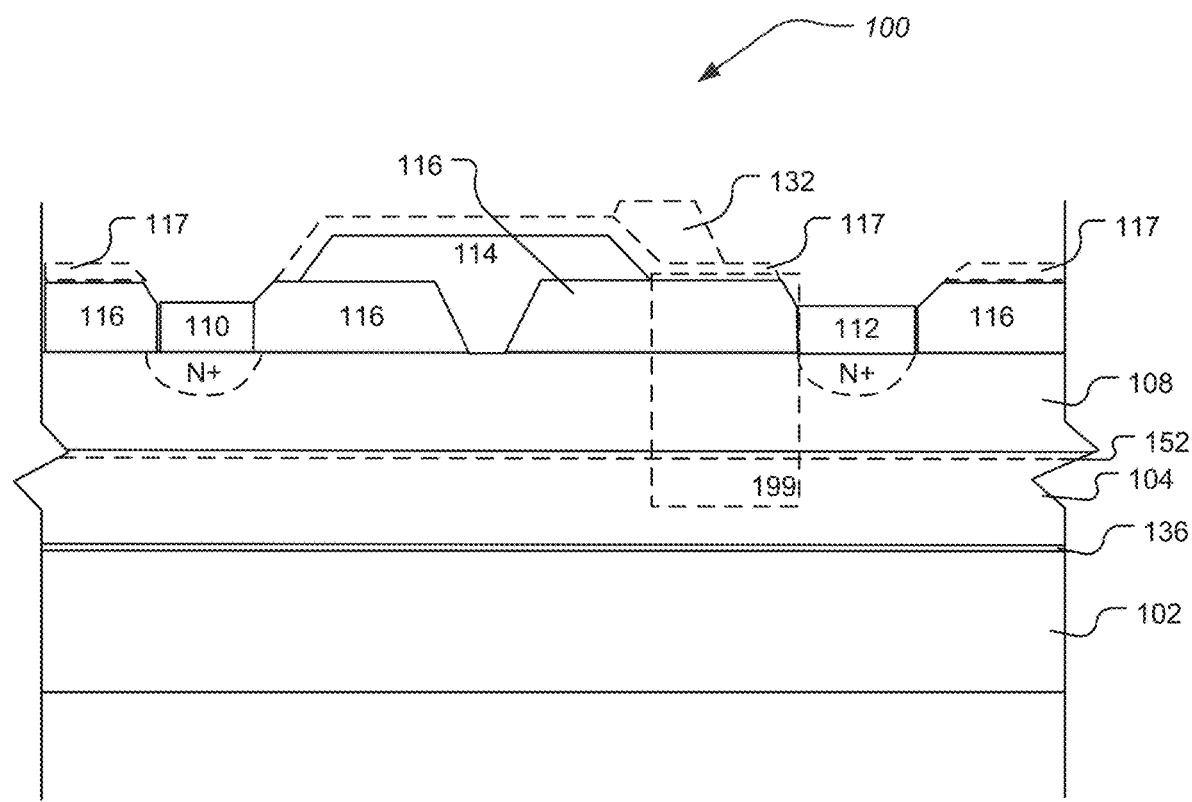
FIG. 1 shows a cross-sectional view of one aspect of a transistor according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also affect operating parameters. Of the characteristics that affect a transistor's operating parameters, the capacitance, the power gain, and the efficiency may have an effect on a transistor's operational characteristics.

Capacitance may be a ratio of the change in an electric charge in a system to the corresponding change in an electric potential of the system. Reducing capacitance between an output and an input of a transistor may result in improved performance.

Power gain may be a measure of the ability to increase the power or amplitude of a signal from the input to the output port by adding energy converted from a power supply to the signal. It may be defined as the mean ratio of the signal amplitude or power at the output to the amplitude or power at the input. Increasing power gain of a transistor may result in improved performance. Other known power gain measures and characteristics are contemplated as well.

Efficiency may be defined as an output power dissipated in a load divided by the total power taken from the supply source. Increasing efficiency of a transistor may result in improved performance. Other known efficiency measures and characteristics are contemplated as well.

The disclosure includes both extrinsic and intrinsic semiconductors. Intrinsic semiconductors are undoped (pure). Extrinsic semiconductors are doped, meaning an agent has been introduced to change the electron and hole carrier concentration of the semiconductor at thermal equilibrium. Both p-type and n-type semiconductors are disclosed, with p-types having a larger hole concentration than electron concentration, and n-types having a larger electron concentration than hole concentration.

Silicon carbide (SiC) has excellent physical and electronic properties, which should theoretically allow production of electronic devices that can operate at higher temperatures, higher power, and higher frequency than devices produced from silicon (Si) or gallium arsenide (GaAs). The high electric breakdown field of about 4×E6 V/cm, high saturated electron drift velocity of about 2.0×E7 cm/sec and high thermal conductivity of about 4.9 W/cm-° K indicate that SiC would be suitable for high frequency and high power applications.

As used herein, the term "Group III-nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN, and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds.

Group III-nitride HEMTs need the improvement of power gain and efficiency, which are normally limited by the high gate drain capacitance induced by the high electron concentration around the gate edge. This disclosure presents a number of different aspects to improve the power gain, efficiency performance, and/or other performance characteristics by selectively reducing electron concentration around the drain-side gate and/or drain-side gate edge.

FIG. 1 shows a cross-sectional view of one aspect of a transistor according to the disclosure.

In particular, FIG. 1 shows a cross-sectional view of a transistor 100. The transistor 100 may include a substrate layer 102 and a buffer layer 104. The transistor 100 may further include a barrier layer 108 arranged on the buffer layer 104. In one aspect, the barrier layer 108 may be arranged directly on the buffer layer 104. The transistor 100 may further include a source 110, a gate 114, and a drain 112. In one aspect, a bandgap of the buffer layer 104 may be less than a bandgap of the barrier layer 108 to form a two-dimensional electron gas (2DEG) at a heterointerface 152 between the buffer layer 104 and barrier layer 108 when biased at an appropriate level. In one aspect, the buffer layer 104 is a Group III-nitride material, such as GaN, and the barrier layer 108 is a Group III-nitride material, such as AlGaN or AlN. In some aspects, there are intervening layer(s) or region(s) between the substrate layer 102 and the buffer layer 104, such as a nucleating layer 136. In one aspect, there are intervening layer(s) or region(s) (not shown) between the buffer layer 104 and the barrier layer 108. In one aspect, the barrier layer 108 is made of multiple layers, such as an AlN barrier layer on the buffer layer 104, and an AlGaN layer on the AlN barrier layer. In one aspect, there are intervening layer(s) or region(s) between the barrier layer 108 and a protective layer 116 and/or the source 110, the gate 114 and/or the drain 112. In one aspect, the composition of these layers can be step-wise or continuously graded. In one aspect, the barrier layer 108 can start with a higher percentage of Al near the buffer layer 104 and decrease in Al percentage away from the buffer layer 104.

Additionally, the transistor 100 may include an electron concentration reduction structure 199. In one aspect, the electron concentration reduction structure 199 may be located on the gate—drain side of the transistor 100. In one aspect, the electron concentration reduction structure 199 may be located on the gate—drain side of the transistor 100 closer to the gate 114 than the drain 112. In one aspect, the electron concentration reduction structure 199 may be located anywhere in the transistor 100 including above an interface between the barrier layer 108 and the buffer layer 104. In one aspect, the electron concentration reduction structure 199 may be located anywhere in the transistor 100 including in, on, and/or between the barrier layer 108 and/or the buffer layer 104.

In one aspect, the electron concentration reduction structure 199 may be structured and arranged in the barrier layer 108. In one aspect, the electron concentration reduction structure 199 may be structured and arranged in a protective layer 116. In one aspect, the electron concentration reduction structure 199 may be structured and arranged in the buffer layer 104. In one aspect, the electron concentration reduction structure 199 may be structured and arranged partially in the protective layer 116 and partially in the barrier layer 108. In one aspect, the electron concentration reduction structure 199 may be structured and arranged partially in the protective layer 116, partially in the barrier layer 108, and partially in the buffer layer 104. In other aspects, the electron concentration reduction structure 199 may be located in one or more other layers of the transistor 100.

In particular, the electron concentration reduction structure 199 may be configured as a device, structure, configuration, or the like for reducing gate adjacent electron concentration as described in greater detail herein. In this regard, the electron concentration reduction structure 199 reduces gate adjacent electron concentration in areas adjacent the gate 114. In one aspect, the electron concentration reduction structure 199 may be configured as an electron concentration control and/or reduction feature, component, element, section, portion, structure, and/or the like as disclosed herein. In particular, the electron concentration reduction structure 199 may be configured as a device, structure, configuration, or the like for reducing gate adjacent electron concentration in comparison to prior art transistors.

In one aspect, the electron concentration reduction structure 199 may reduce electron concentration around the gate 114, may reduce electron concentration around an edge of the gate 114, may reduce electron concentration, may increase power gain, may increase efficiency, may decouple the gate 114 from the drain 112, may decouple the gate 114 from the source 110, may reduce electron concentration, such as in a portion of the barrier layer 108 between the gate 114 and drain 112 and/or between the gate 114 and the source 110, may reduce capacitance, such as the capacitance between the gate 114 and the drain 112 and/or between the gate 114 and the source 110, and the like. Additionally, as described herein, the electron concentration reduction structure 199 may be utilized in a Group III-nitride based high-electron mobility transistors (HEMTs) as well as HEMTs of other material systems. However, the disclosure is not limited to this particular application of the electron concentration reduction structure 199. The electron concentration reduction structure 199 may be utilized in other similar semiconductor based transistor devices with similar operational improvements. For brevity, the electron concentration reduction structure 199 will be generally described in an application that may be a Group III-nitride based high-electron mobility transistor (HEMT).

In one aspect, the electron concentration reduction structure 199 may utilize one or more of the aspects described below with reference to FIG. 3, FIG. 4, FIG. 5, and FIG. 6. In one aspect, the electron concentration reduction structure 199 may utilize two of the aspects combined described below with reference to FIG. 3, FIG. 4, FIG. 5, and FIG. 6. In one aspect, the electron concentration reduction structure 199 may utilize three of the aspects combined described below with reference to FIG. 3, FIG. 4, FIG. 5, and FIG. 6. In one aspect, the electron concentration reduction structure 199 may utilize all of the aspects combined described below with reference to FIG. 3, FIG. 4, FIG. 5, and FIG. 6. In addition, any of the particular aspects described for any of the Figures can be utilized in any of the other Figures.

Figure 2:
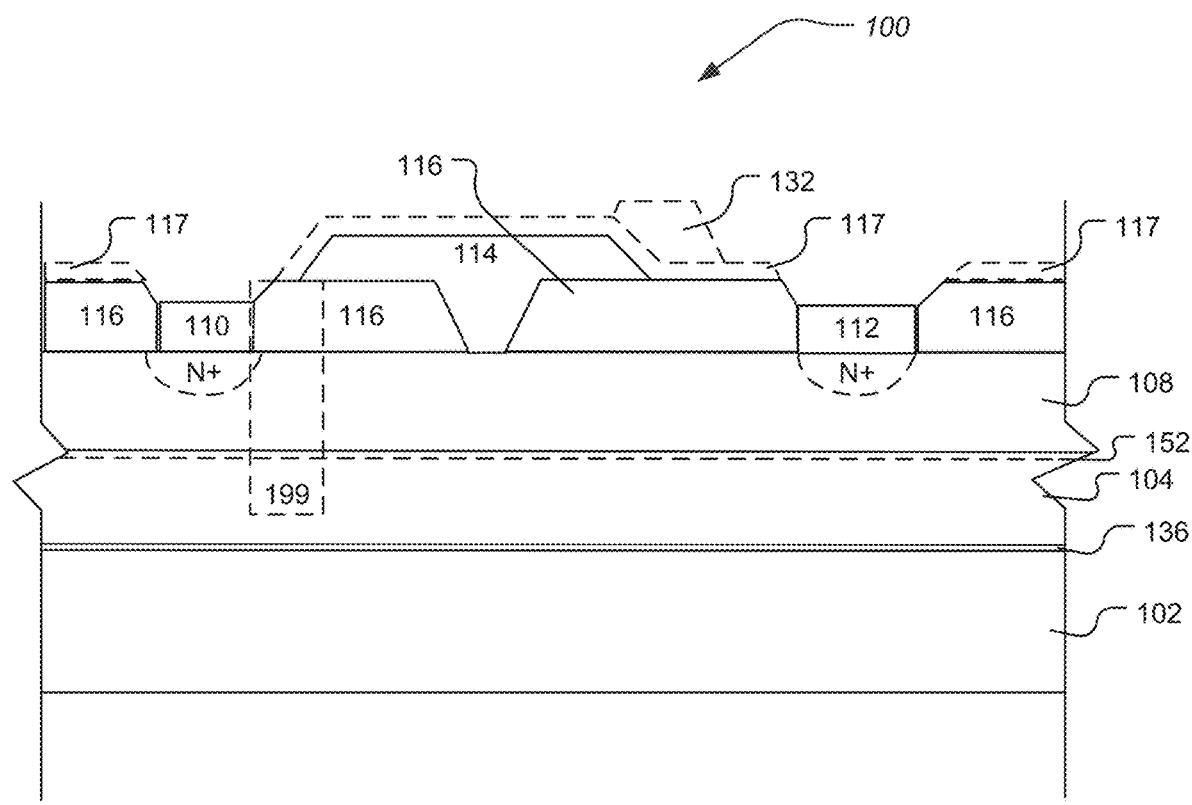
FIG. 2 shows a cross-sectional view of one aspect of a transistor according to the disclosure.

FIG. 2 shows a cross-sectional view of one aspect of a transistor according to the disclosure.

In particular, FIG. 2 is a transistor 100 that may include one or more of the features of the disclosure. FIG. 2 further illustrates that the electron concentration reduction structure 199 may be included in other locations of the transistor 100 including a location between the source 110 and the gate 114, a location adjacent the gate 114, a location adjacent the source 110, or the like. In one aspect, the electron concentration reduction structure 199 may be located anywhere in the transistor 100 including above an interface between the barrier layer 108 and the buffer layer 104. In one aspect, the electron concentration reduction structure 199 may be located anywhere in the transistor 100 including in, on, and/or between the barrier layer 108 and/or the buffer layer 104. However, for brevity of disclosure, the electron concentration reduction structure 199 may be illustrated and described in relation to an exemplary location. With this in mind, the disclosure contemplates other locations such as the location illustrated in FIG. 2, as well as others, and the various implementations of the electron concentration reduction structure 199 described herein may be constructed in those locations based on the disclosure.

In one aspect, the electron concentration reduction structure 199 may reduce electron concentration around the gate 114, may reduce electron concentration around an edge of the gate 114, may reduce electron concentration, may increase power gain, may increase efficiency, may decouple the gate 114 from the source 110, may decouple the gate 114 from the drain 112, may reduce electron concentration, such as in a portion of the barrier layer 108 between the gate 114 and source 110 and/or between the gate 114 and the drain 112, may reduce capacitance, such as the capacitance between the gate 114 and the source 110 and/or between the gate 114 and the drain 112, and the like.

Figure 3:
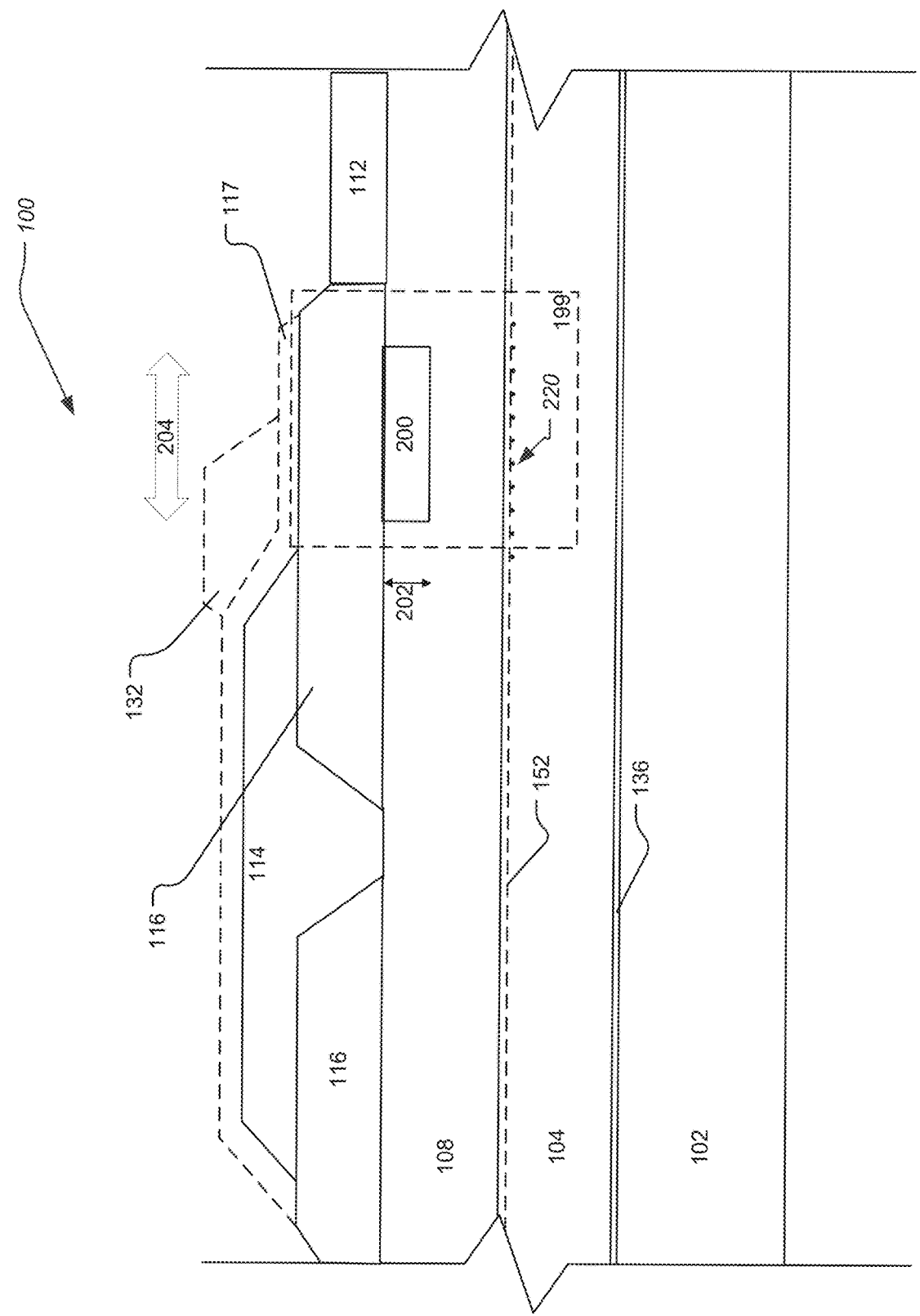
FIG. 3 shows a partial cross-sectional view of another aspect of a transistor according to the disclosure.

FIG. 3 shows a partial cross-sectional view of another aspect of a transistor according to the disclosure.

In particular, FIG. 3 illustrates a first aspect of the electron concentration reduction structure 199. In this regard, the electron concentration reduction structure 199 illustrated in FIG. 3 may include an implanted portion 200. The implanted portion 200 may be implanted in the barrier layer 108. However, the implanted portion 200 may be implanted in other locations within the transistor 100. For example, the implanted portion 200 may be at least partially implanted in the protective layer 116, may be at least partially implanted in the buffer layer 104, may be partially implanted in the substrate layer 102, or the like.

In one aspect, the implanted portion 200 may include implantation of P dopants. In one aspect, the implanted portion 200 may include implantation of fluorine. In one aspect, the implanted portion 200 may include implantation of fluorine ions. In one aspect, the implanted portion 200 may include implantation of negatively charged fluorine. In one aspect, the implanted portion 200 may include implantation of negatively charged fluorine ions. In one aspect, the implanted portion 200 may include implantation of fluorine in the barrier layer 108. In one aspect, the implanted portion 200 may include implantation of fluorine ions in the barrier layer 108. In one aspect, the barrier layer 108 may be a Group III-nitride barrier layer, such as an AlGaN or AlN barrier layer. Other p-type dopants can be used.

In one aspect, the implanted portion 200 may include implantation of material to damage the barrier layer 108. In one aspect, the implanted portion 200 may include implantation of ions to damage the barrier layer 108. In one aspect, the implanted portion 200 may include implantation of argon. In one aspect, the implanted portion 200 may include implantation of argon ions. In one aspect, the implanted portion 200 may include implantation of argon in the barrier layer 108 to damage the barrier layer 108. In one aspect, the implanted portion 200 may include implantation of argon ions in the barrier layer 108 to damage the barrier layer 108. In one aspect, the barrier layer 108 may be an AlGaN or AlN barrier layer. Other implants are possible.

In one aspect, with reference to arrow 202, the implanted portion 200 may have a depth of less than 14 nm, less than 12 nm, less than 10 nm, and/or less than 8 nm. In one aspect, the implanted portion may have a depth of 2 nm to 14 nm, 2 nm to 4 nm, 4 nm to 6 nm, 6 nm to 8 nm, 8 nm to 12 nm, 8 nm to 10 nm, 9 nm to 11 nm, 10 nm to 12 nm, and/or 12 nm to 14 nm. In one aspect, the implanted portion 200 may extend at least partially down to the buffer layer 104.

In one aspect, the implanted portion 200 may have a depth of 20% to 70% of the barrier layer 108, 20% to 40% of the barrier layer 108, 40% to 60% of the barrier layer 108, 50% to 60% of the barrier layer 108, and/or 60% to 70% of the barrier layer 108.

In one aspect, with reference to arrow 204, the implanted portion 200 may have a length of 200 nm to 2000 nm, 200 nm to 300 nm, 300 nm to 400 nm, 400 nm to 500 nm, 500 nm to 600 nm, 600 nm to 700 nm, 700 nm to 800 nm, 800 nm to 1200 nm, 1200 nm to 1400 nm, 1400 nm to 1600 nm, 1600 nm to 1800 nm, and/or 1800 nm to 2000 nm.

In one aspect, the implanted portion 200 may extend continuously along the edge of the gate 114 perpendicular to the arrow 204 and the arrow 202. In one aspect, the implanted portion 200 may extend discontinuously along the edge of the gate 114 perpendicular to the arrow 204 and the arrow 202. In one aspect, the implanted portion 200 may extend partially along the edge of the gate 114 perpendicular to the arrow 204 and the arrow 202. In one aspect, the implanted portion 200 may extend only in selective areas along the edge of the gate 114 perpendicular to the arrow 204 and the arrow 202. In one aspect, a protective layer 116 may be arranged on the implanted portion 200. In one aspect, the implanted portion may have a uniform, non-uniform, and/or changing distribution of implants.

The implanted portion 200 as disclosed may reduce electron concentration around the gate 114, may reduce electron concentration around an edge of the gate 114, may reduce electron concentration, may increase power gain, may increase efficiency, may decouple the gate 114 from the drain 112, may decouple the gate 114 from the source 110, may reduce electron gas concentration, may reduce capacitance such as gate to drain capacitance and/or gate to source capacitance, and the like. In one aspect, these characteristics may present in the area 220 adjacent, in, or near the hetero interface 152.

Figure 4:
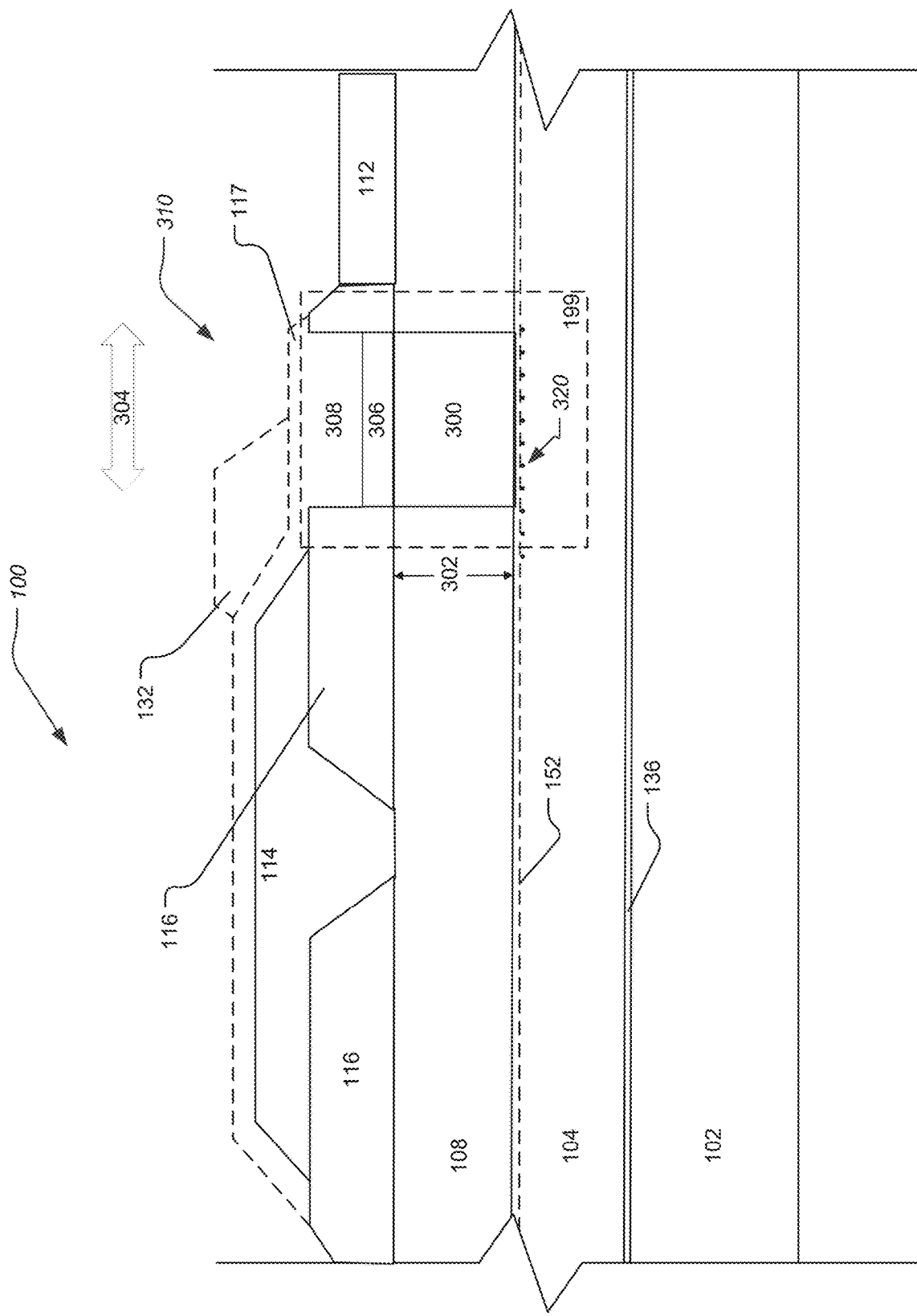
FIG. 4 shows a partial cross-sectional view of another aspect of a transistor according to the disclosure.

FIG. 4 shows a partial cross-sectional view of another aspect of a transistor according to the disclosure.

In particular, FIG. 4 illustrates a second aspect of the electron concentration reduction structure 199. In this regard, the electron concentration reduction structure 199 illustrated in FIG. 4 may include a first portion 300 and a second portion 306. The first portion 300 may be arranged in the barrier layer 108. However, the first portion 300 may be located in other locations within the transistor 100. For example, the first portion 300 may be at least partially in the protective layer 116, may be at least partially in the buffer layer 104, may be partially in the substrate layer 102, or the like.

In one aspect, the first portion 300 may include the same material as the barrier layer 108. In one aspect, the first portion 300 may include a different material than the barrier layer 108. In one aspect, the first portion 300 may include a Group III-nitride material, such as AlGaN that is regrown and may have the same composition as the barrier layer 108. In one aspect, the first portion 300 may include a Group III-nitride material, such as AlGaN, that is regrown and may have a different composition as the barrier layer 108.

In one aspect, the first portion 300 may include AlGaN having 5%-18% aluminum that is regrown and the barrier layer 108 may include AlGaN having 18%-25% aluminum.

In one aspect, the first portion 300 may include AlGaN having 5%-18% aluminum, AlGaN having 5%-10% aluminum, AlGaN having 8%-13% aluminum, AlGaN having 10%-15% aluminum, and/or AlGaN having 15%-18% aluminum.

In one aspect, the barrier layer 108 may include AlGaN having 18%-25% aluminum, AlGaN having 18%-20% aluminum, AlGaN having 19%-21% aluminum, AlGaN having 20%-22% aluminum, and/or AlGaN having 23%-25% aluminum.

In one aspect, with reference to arrow 302, the first portion 300 may have a depth of less than 22 nm, less than 18 nm, less than 14 nm, less than 10 nm, less than 8 nm, and/or less than 6 nm. In one aspect, the first portion 300 may have a depth of 6 nm to 20 nm, 6 nm to 8 nm, 8 nm to 12 nm, 10 nm to 14 nm, 12 nm to 16 nm and/or 14 nm to 20 nm. In one aspect, the first portion 300 may extend at least partially down to the buffer layer 104.

In one aspect, the first portion 300 may have a depth of 30% to 100% of the barrier layer 108, 30% to 50% of the barrier layer 108, 50% to 70% of the barrier layer 108, 60% to 80% of the barrier layer 108, 70% to 90% of the barrier layer 108, and/or 80% to 100% of the barrier layer 108.

In one aspect, with reference to arrow 304, the first portion 300 may have a length of 200 nm to 2000 nm, 200 nm to 300 nm, 300 nm to 400 nm, 400 nm to 500 nm, 500 nm to 600 nm, 600 nm to 700 nm, 700 nm to 800 nm, 800 nm to 1200 nm, 1200 nm to 1400 nm, 1400 nm to 1600 nm, 1600 nm to 1800 nm, and/or 1800 nm to 2000 nm.

In one aspect, the first portion 300 may extend continuously along the edge of the gate 114 perpendicular to the arrow 304 and the arrow 302. In one aspect, the first portion 300 may extend discontinuously along the edge of the gate 114 perpendicular to the arrow 304 and the arrow 302. In one aspect, the first portion 300 may extend partially along the edge of the gate 114 perpendicular to the arrow 304 and the arrow 302. In one aspect, the first portion 300 may extend only in selective areas along the edge of the gate 114 perpendicular to the arrow 304 and the arrow 302. In some aspects, the first portion 300 can extend uniformly, non-uniformly, and/or a changing fashion with respect to composition, doping, and/or thickness.

In further aspects, the second portion 306 may be arranged on the first portion 300. In one aspect, the second portion 306 may be arranged directly on the first portion 300. In further aspects, the second portion 306 may be configured with a recess 308 such that a top surface of the second portion 306 is below a top surface of the protective layer 116. In one aspect, a depth of the recess 308 may be 10% to 80% a depth of the protective layer 116, 10% to 30% a depth of the protective layer 116, 30% to 50% a depth of the protective layer 116, 50% to 70% a depth of the protective layer 116, and/or 60% to 80% a depth of the protective layer 116. In one aspect, the second portion 306 may be a protective layer. In one aspect, the second portion 306 may be a protective layer having the same composition as the protective layer 116. In one aspect, the second portion 306 may be the protective layer 116.

In one aspect, prior to formation of the first portion 300, the barrier layer 108 may be etched down, for example, to the buffer layer 104, to form a recess 310. Thereafter, the first portion 300 may be regrown in the recess 310.

The first portion 300 as disclosed may reduce electron concentration around the gate 114, may reduce electron concentration around an edge of the gate 114, may reduce electron concentration, e.g., in at least a portion between the gate 114 and the drain 112 and/or between the gate 114 and the source 110, may increase power gain, may increase efficiency, may decouple the gate 114 from the drain 112, may decouple the gate 114 from the source 110, may reduce electron gas concentration, may reduce capacitance, and the like. In one aspect, these characteristics may present in the area 320 adjacent, in, or near the heterointerface 152.

Figure 5:
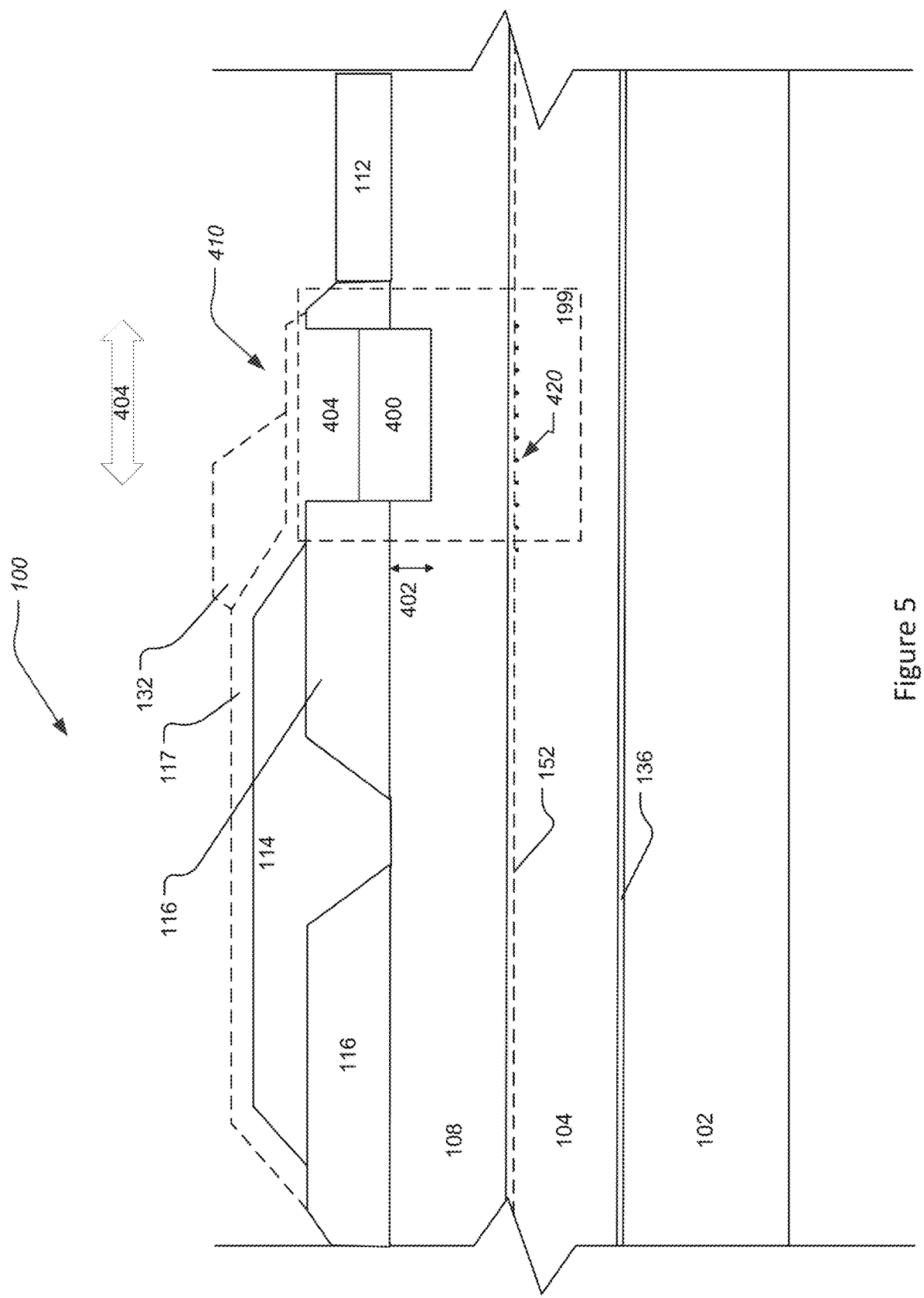
FIG. 5 shows a partial cross-sectional view of another aspect of a transistor according to the disclosure.

FIG. 5 shows a partial cross-sectional view of another aspect of a transistor according to the disclosure.

In particular, FIG. 5 illustrates a third aspect of the electron concentration reduction structure 199. In this regard, the electron concentration reduction structure 199 illustrated in FIG. 5 may include a recessed portion 400. The recessed portion 400 may be arranged in the barrier layer 108. However, the recessed portion 400 may be located in other locations within the transistor 100. For example, the recessed portion 400 may be at least partially in the protective layer 116, may be at least partially in the buffer layer 104, may be partially in the substrate layer 102, or the like.

In one aspect, with reference to arrow 402, the recessed portion 400 may have a depth of less than 22 nm, less than 18 nm, less than 14 nm, and/or less than 10 nm. In one aspect, the first portion 300 may have a depth of 8 nm to 20 nm, 8 nm to 12 nm, 10 nm to 14 nm, 12 nm to 16 nm and/or 14 nm to 20 nm.

In one aspect, the recessed portion 400 may have a depth of 40% to 100% of the barrier layer 108, 40% to 60% of the barrier layer 108, 60% to 80% of the barrier layer 108, 70% to 90% of the barrier layer 108, and/or 80% to 100% of the barrier layer 108.

In one aspect, with reference to arrow 404, the recessed portion 400 may have may have a length of 200 nm to 2000 nm, 200 nm to 300 nm, 300 nm to 400 nm, 400 nm to 500 nm, 500 nm to 600 nm, 600 nm to 700 nm, 700 nm to 800 nm, 800 nm to 1200 nm, 1200 nm to 1400 nm, 1400 nm to 1600 nm, 1600 nm to 1800 nm, and/or 1800 nm to 2000 nm.

In one aspect, the recessed portion 400 may extend continuously along the edge of the gate 114 perpendicular to the arrow 404 and the arrow 402. In one aspect, the recessed portion 400 may extend discontinuously along the edge of the gate 114 perpendicular to the arrow 404 and the arrow 402. In one aspect, the recessed portion 400 may extend partially along the edge of the gate 114 perpendicular to the arrow 404 and the arrow 402. In one aspect, the recessed portion 400 may extend only in selective areas along the edge of the gate 114 perpendicular to the arrow 404 and the arrow 402. In some aspects, the recessed portion 400 may be uniform, non-uniform, and/or the like in shape and/or thickness. In some aspects, the recessed portion 400 can be a void, filled, or partially filled with a material or different materials, such as dielectric or insulating material(s). In one aspect, the recessed portion 400 may be formed with materials that are made of a single or multiple layer(s) and/or regions. In some aspects, the filled material may be of uniform, non-uniform, or changing composition.

In one aspect, prior to formation of the recessed portion 400, the barrier layer 108 may be etched to form a recess 410. Thereafter, the recessed portion 400 may be formed. In one aspect, be recessed portion 400 may be a protective layer. In one aspect, the recessed portion 400 may be a protective layer having the same composition as the protective layer 116. In one aspect, the recessed portion 400 may be the protective layer 116.

The recessed portion 400 as disclosed may reduce electron concentration around the gate 114, may reduce electron concentration around an edge of the gate 114, may reduce electron concentration, may increase power gain, may increase efficiency, may decouple the gate 114 from the drain 112, may decouple the gate 114 from the source 110, may reduce electron gas concentration, may reduce capacitance, such as the capacitance between the gate 114 and drain 112 and/or between the gate 114 and the source 110, and the like. In one aspect, these characteristics may present in the area 420 adjacent, in, or near the heterointerface 152.

Figure 6:
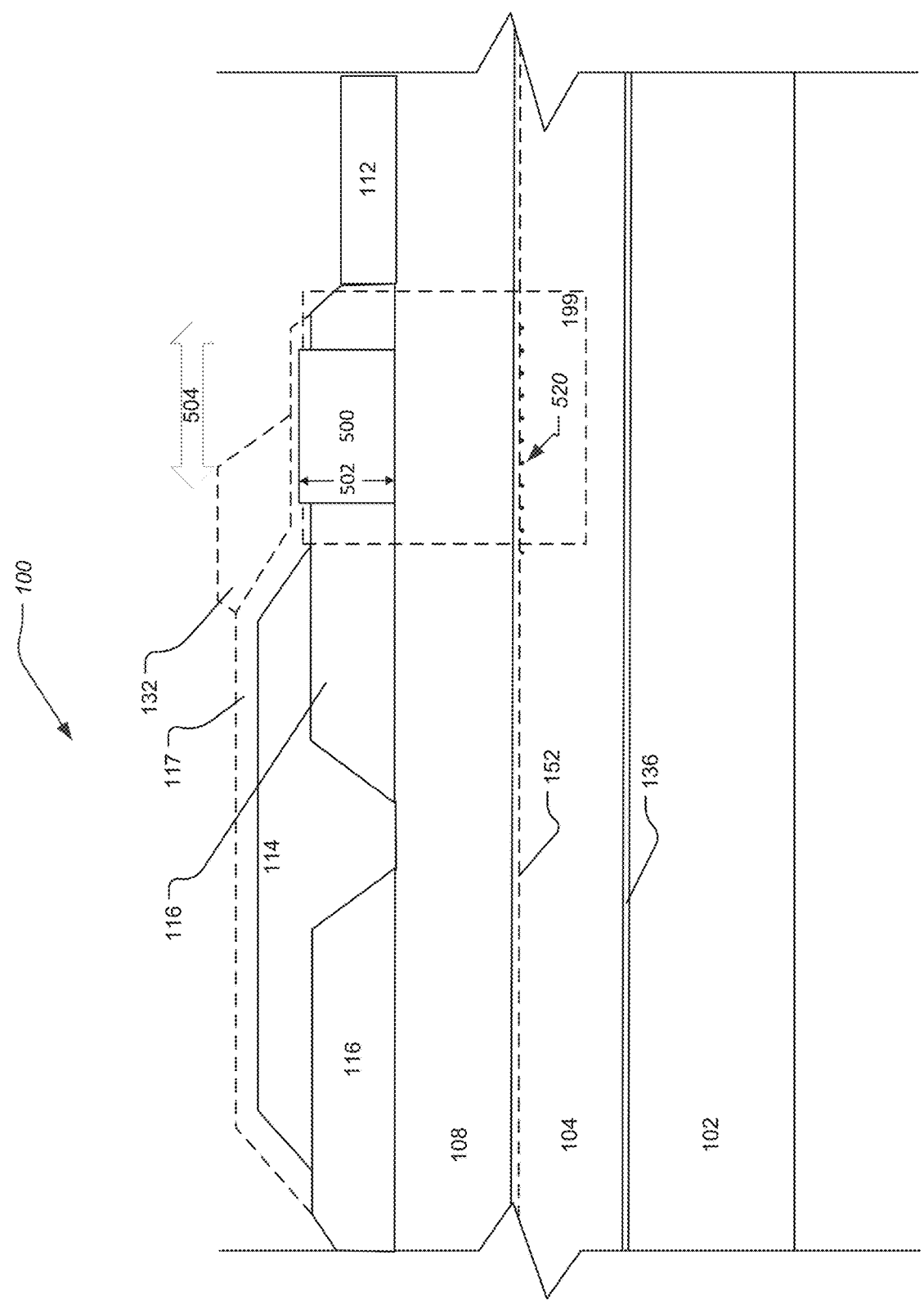
FIG. 6 shows a partial cross-sectional view of another aspect of a transistor according to the disclosure.

FIG. 6 shows a partial cross-sectional view of another aspect of a transistor according to the disclosure.

In particular, FIG. 6 illustrates a fourth aspect of the electron concentration reduction structure 199. In this regard, the electron concentration reduction structure 199 illustrated in FIG. 6 may include a portion 500. In one aspect, the portion 500 may be arranged on the barrier layer 108. In one aspect the portion 500 may be adjacent the protective layer 116. In one aspect, the portion 500 may be arranged on the barrier layer 108 and adjacent the protective layer 116. However, the portion 500 may be located in other locations within the transistor 100. For example, the portion 500 may be at least partially in the buffer layer 104, may be partially in the substrate layer 102, or the like.

In one aspect, the portion 500 may be a Group III-nitride, such as GaN. In one aspect, the portion 500 may be P—GaN. In one aspect, the portion 500 may be P—GaN having a concentration of P dopant in a range of 0.5 e12/cm$^2$ to 2 e12/cm$^2$, 0.8 e12/cm$^2$ to 1.2 e12/cm$^2$, 1.2 e12/cm$^2$ to 2 e12/cm$^2$. In one aspect, the P dopants may include zinc, iron, carbon, magnesium, and the like. In other aspects, the portion 500 may include different materials, different P dopant concentrations, and different P dopants. In one aspect, the portion 500 may be grown by epitaxial growth. In one aspect, the portion 500 may be grown by epitaxial growth over an entire length of the barrier layer 108 and selectively removed.

In one aspect, with reference to arrow 502, the portion 500 may have a depth of less than 22 nm, less than 18 nm, less than 14 nm, and/or less than 10 nm. In one aspect, the portion 500 may have a depth of 8 nm to 20 nm, 8 nm to 12 nm, 10 nm to 14 nm, 12 nm to 16 nm and/or 14 nm to 20 nm.

In one aspect, with reference to arrow 504, the portion 500 may have may have a length of 200 nm to 2000 nm, 200 nm to 300 nm, 300 nm to 400 nm, 400 nm to 500 nm, 500 nm to 600 nm, 600 nm to 700 nm, 700 nm to 800 nm, 800 nm to 1200 nm, 1200 nm to 1400 nm, 1400 nm to 1600 nm, 1600 nm to 1800 nm, and/or 1800 nm to 2000 nm.

In one aspect, the portion 500 may extend continuously along the edge of the gate 114 perpendicular to the arrow 504 and the arrow 502. In one aspect, the portion 500 may extend discontinuously along the edge of the gate 114 perpendicular to the arrow 504 and the arrow 502. In one aspect, the portion 500 may extend partially along the edge of the gate 114 perpendicular to the arrow 504 and the arrow 502. In one aspect, the portion 500 may extend only in selective areas along the edge of the gate 114 perpendicular to the arrow 504 and the arrow 502.

The portion 500 as disclosed may reduce electron concentration around the gate 114, may reduce electron concentration around an edge of the gate 114, may reduce electron concentration, may increase power gain, may increase efficiency, may decouple the gate 114 from the drain 112, may decouple the gate 114 from the source 110, may reduce electron gas concentration, may reduce capacitance, such as the capacitance between the gate 114 and drain 112 and/or between the gate 114 and the source 110, and the like. In one aspect, these characteristics may present in the area 520 adjacent, in, or near the heterointerface 152.

Figure 7:
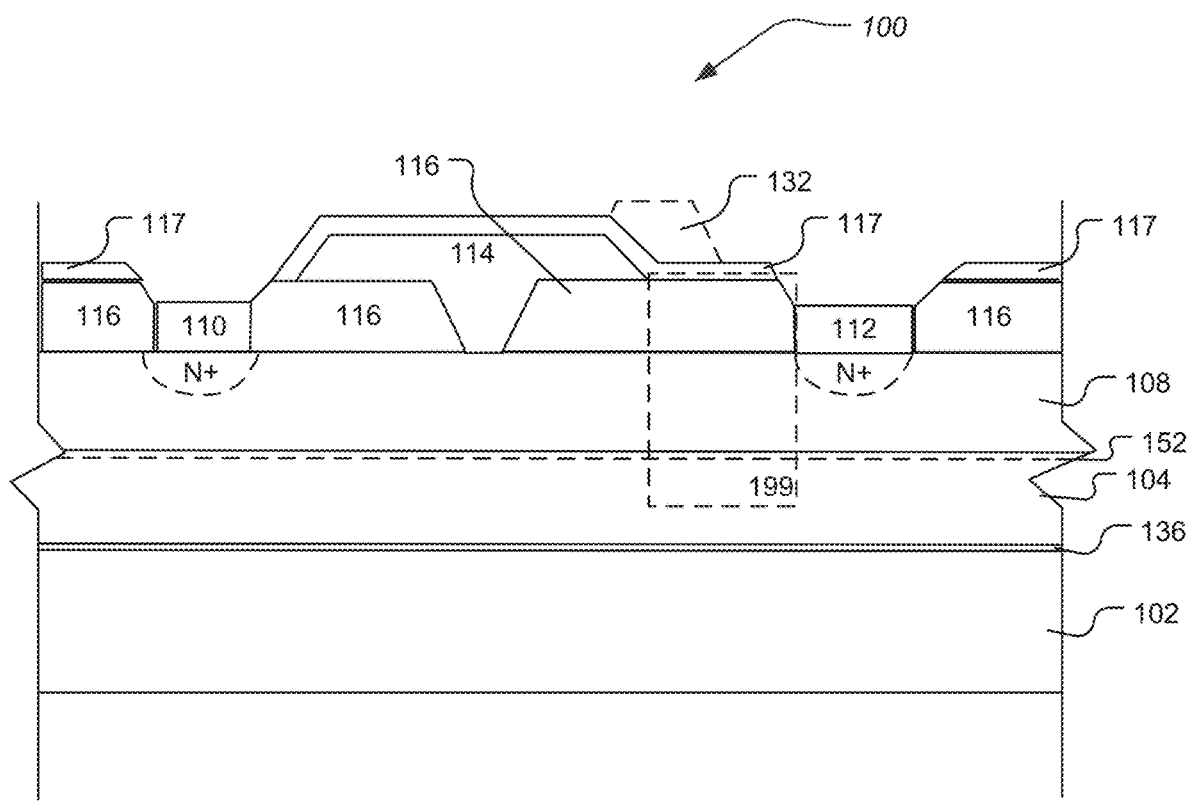
FIG. 7 shows a cross-sectional view of another aspect of a transistor according to the disclosure.

FIG. 7 shows a cross-sectional view of another aspect of a transistor according to the disclosure.

In particular, FIG. 7 is a transistor 100 that may include one or more of the features of the disclosure. FIG. 7 further illustrates that the transistor 100 may include a spacer layer 117 and may include a nucleation layer 136.

In aspects of the transistor 100 of the disclosure, the substrate layer 102 may be made of Silicon Carbide (SiC) or sapphire. In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be 1E15/cm$^3$ or less. In one aspect, the substrate layer 102 may be formed of SiC selected from the group of 6H, 4H, 15R, 3C SiC, or the like. In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

On the substrate layer 102, a buffer layer 104, and/or a nucleation layer 136, may be formed. In one aspect, the buffer layer 104 is formed on the substrate layer 102. In one aspect, the buffer layer 104 is formed directly on the substrate layer 102. In one aspect, the nucleation layer 136 may be formed on the substrate layer 102. In one aspect, the nucleation layer 136 may be formed directly on the substrate layer 102. Intervening layer(s) and/or region(s) are possible throughout the described structures.

In aspects of the transistor 100 of the disclosure, the nucleation layer 136 may be formed on the substrate layer 102 to reduce a lattice mismatch between the substrate layer 102 and a next layer in the transistor 100. The nucleation layer 136 may include many different materials, such as Group III-nitride materials, with a suitable material being $Al_zGa_{1-z}N$ (0<=z<=1). The nucleation layer 136 may be formed on the substrate layer 102 using known semiconductor growth techniques such as Metal Oxide Chemical Vapor Deposition (MOCVD), Hydride Vapor Phase Epitaxy (HVPE), Molecular Beam Epitaxy (MBE), or the like. In further aspects, there may be intervening layers between the nucleation layer 136 and the substrate layer 102. In further aspects, there may be intervening layers between the nucleation layer 136 and the buffer layer 104.

The buffer layer 104 may be a group III-nitride, such as GaN, Aluminum Gallium Nitride (AlGaN), Aluminum Nitride (AlN), $Al_xGa_yIn_{(1-x-y)}N$ (where 0<=x<=1, 0<=y<=1, x+y<=1), $Al_xIn_yGa_{1-x-y}N$ (where 0<=x<=1 and 0<=y<=1), and the like, or another suitable material and may also include a nucleation layer 136 of a group III-nitride material, such as AlN. In one aspect, the buffer layer 104 is formed of AlGaN. The buffer layer 104 may be a p-type material, or alternatively can be undoped. In one aspect, an AlN nucleation layer 136 may be used to adhere to the substrate layer 102 and may help grow the buffer layer 104. The buffer layer 104 may bind to the substrate layer 102. In one aspect, the nucleation layer 136 may be AlGaN.

In one aspect, the buffer layer 104 may be high purity GaN. In one aspect, the buffer layer 104 may be high purity GaN that may be a low-doped n-type. In one aspect, the buffer layer 104 may also use a higher band gap Group III-nitride layer as a back barrier, such as an AlGaN back barrier, on the other side of the buffer layer 104 from the barrier layer 108 to achieve better electron confinement.

In aspects of the transistor 100 of the disclosure, on the buffer layer 104, the barrier layer 108 may be formed. In one aspect, the barrier layer 108 may be formed directly on the buffer layer 104. The barrier layer 108 may provide an additional layer between the buffer layer 104 and the source 110, the drain 112, and the gate 114. The barrier layer 108 may be AlGaN, AlN, a Group III-nitride, InAlGaN, or another suitable material. In one aspect, the barrier layer 108 may be AlGaN. In one aspect, the barrier layer 108 may be undoped. In one aspect, the barrier layer 108 may be doped. In one aspect, the barrier layer 108 may be an n-type material. In some aspects, the barrier layer 108 may have multiple layers of n-type material having different carrier concentrations. In one aspect, the barrier layer 108 may be a Group III-nitride or a combination thereof. In one aspect, a bandgap of the buffer layer 104 may be less than a bandgap of the barrier layer 108. In one aspect, a bandgap of the buffer layer 104 may be less than a bandgap of the barrier layer 108 to form a two-dimensional electron gas (2DEG) at a heterointerface 152 between the buffer layer 104 and barrier layer 108 when biased at an appropriate level. In one aspect, additional Group III-nitride layer(s) or region(s) and/or other layer(s) or region(s) of different materials are possible on the barrier layer 108 and/or in the overall structure. Any of the layers and/or regions can have uniform, non-uniform, graded and/or changing composition, thicknesses, and/or doping.

In aspects of the transistor 100 of the disclosure, the source 110 and/or the drain 112 may be connected directly to the barrier layer 108. In one aspect, the source 110 and/or drain 112 may be connected indirectly to the barrier layer 108. In one aspect, the barrier layer 108 may include a region under the source 110 and/or drain 112 that is an N+ material. In one aspect, the barrier layer 108 may include a region under the source 110 and/or drain 112 that is Si doped.

In aspects of the transistor 100 of the disclosure, the source 110 and/or the drain 112 may be connected directly to the buffer layer 104. In one aspect, the source 110 and/or drain 112 may be connected indirectly to the buffer layer 104. In one aspect, the buffer layer 104 may include a region under the source 110 and/or drain 112 that is an N+ material. In one aspect, the buffer layer 104 may include a region under the source 110 and/or drain 112 that is Si doped.

To protect and separate the gate 114 and the drain 112, a protective layer 116 may be arranged on the barrier layer 108, on a side opposite the buffer layer 104, adjacent the gate 114 and the drain 112. The protective layer 116 may be a passivation layer made of SiN, AlO, SiO, SiO$_2$, AlN, or the like, or a combination incorporating multiple layers thereof. In one aspect, the protective layer 116 is a passivation layer made of SiN. In one aspect, the protective layer 116 can be deposited using MOCVD, plasma chemical vapor deposition (CVD), hot-filament CVD, or sputtering. In one aspect, the protective layer 116 may include deposition of Si$_3$N$_4$. In one aspect, the protective layer 116 forms an insulating layer. In one aspect, the protective layer 116 forms an insulator. In one aspect, the protective layer 116 may be a dielectric.

In aspects of the transistor 100 of the disclosure, a non-conducting spacer layer 117 may be formed over the gate 114 between the source 110 and the drain 112. In one aspect, the spacer layer 117 may include a layer of non-conducting material such as a dielectric. In one aspect, the spacer layer 117 may include a number of different layers of dielectrics or a combination of dielectric layers. In one aspect, the spacer layer 117 may be many different thicknesses, with a suitable range of thicknesses being approximately 0.05 to 2 microns.

In one aspect, the spacer layer 117 may include a material such as a dielectric or insulating material, such as SiN, SiO2, etc. In some aspects the spacer layer 117 may be a passivation layer, such as SiN, AlO, SiO, SiO$_2$, AlN, or the like, or a combination incorporating multiple layers thereof In aspects of the transistor 100 of the disclosure, the buffer layer 104 may be designed to be of the high purity type where the Fermi level is in the upper half of the bandgap, which minimizes slow trapping effects normally observed in GaN HEMTs. In this regard, the traps under the Fermi level are filled always and thus slow transients may be prevented. In some aspects, the buffer layer 104 may be as thin as possible consistent with achieving good crystalline quality. Applicants have already demonstrated 0.4 µm layers with good quality.

In aspects of the transistor 100 of the disclosure, a Group III-nitride nucleation layer 136 and/or buffer layer 104 may be grown on the substrate layer 102 via an epitaxial crystal growth method, such as MOCVD (Metalorganic Chemical Vapor Deposition), HVPE (Hydride Vapor Phase Epitaxy) or MBE (Molecular Beam Epitaxy). The formation of the nucleation layer may depend on the material of the substrate layer 102.

In aspects of the transistor 100 of the disclosure, the buffer layer 104 may be formed with Lateral Epitaxial Overgrowth (LEO). LEO can, for example, improve the crystalline quality of GaN layers. When semiconductor layers of a HEMT are epitaxial, the layer upon which each epitaxial layer is grown may affect the characteristics of the device. For example, LEO may reduce dislocation density in epitaxial GaN layers.

In aspects of the transistor 100 of the disclosure, the buffer layer 104 may include nonpolar GaN. In one aspect, the buffer layer 104 may include semipolar GaN. In one aspect, the buffer layer 104 may include hot wall epitaxy. In one aspect, the buffer layer 104 may include hot wall epitaxy having a thickness in the range of 0.15 microns to 0.25 microns, 0.2 microns to 0.3 microns, 0.25 microns to 0.35 microns, 0.3 microns to 0.35 microns, 0.35 microns to 0.4 microns, 0.4 microns to 0.45 microns, 0.45 microns to 0.5 microns, 0.5 microns to 0.55 microns, or 0.15 microns to 0.55 microns.

In aspects of the transistor 100 of the disclosure, a gate contact may be provided for the gate 114 in between the source 110 and the drain 112. Furthermore, in certain aspects of the disclosure, the gate contact may be disposed on the barrier layer 108. In one aspect, the gate contact may be disposed directly on the barrier layer 108.

The gate 114 may be formed of platinum (Pt), nickel (Ni), and/or gold (Au), however, other metals known to one skilled in the art to achieve the Schottky effect, may be used. In one aspect, the gate 114 may include a Schottky gate contact that may have a three layer structure. Such a structure may have advantages because of the high adhesion of some materials. In one aspect, the gate 114 may further include an overlayer of highly conductive metal. In one aspect, the gate 114 may be configured as a T-shaped gate.

In aspects of the transistor 100 of the disclosure, one or more metal overlayers may be provided on one or more of the source 110, the drain 112, and the gate 114. The overlayers may be Au, Silver (Ag), Al, Pt, Ti, Si, Ni, Al, and/or Copper (Cu). Other suitable highly conductive metals may also be used for the overlayers.

Figure 8:
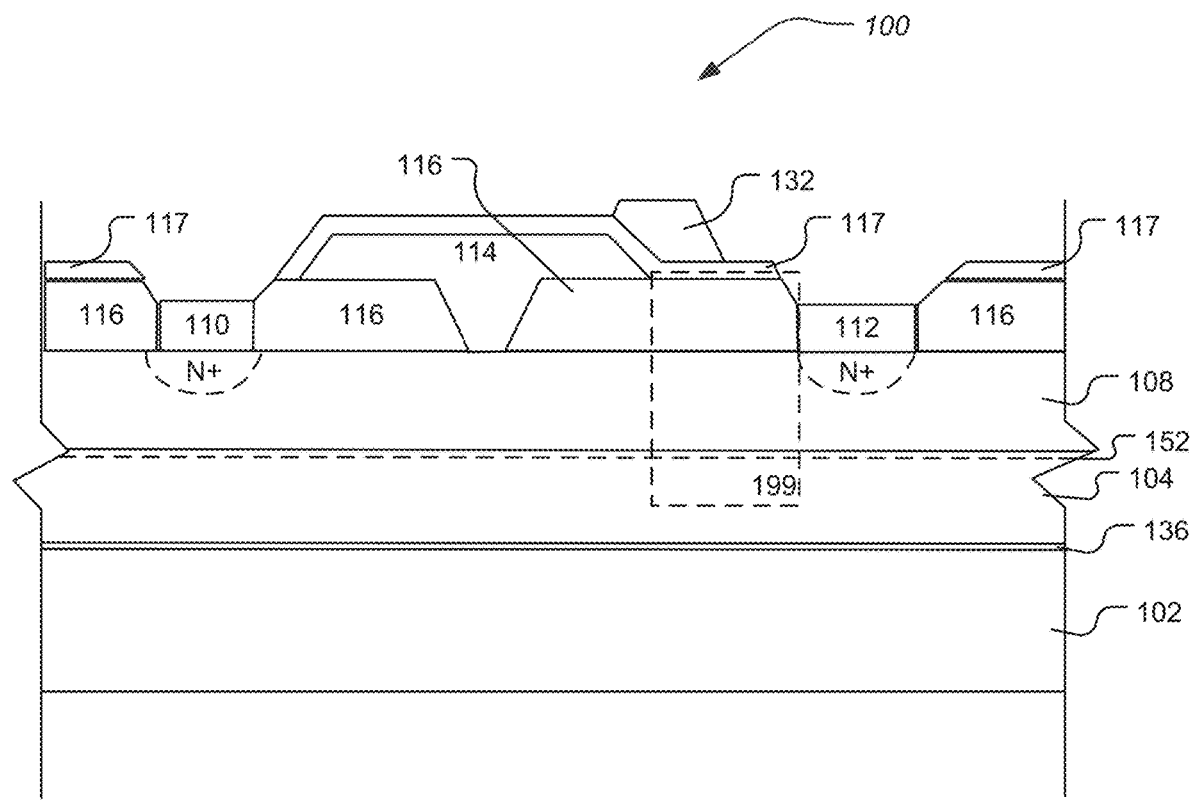
FIG. 8 shows a cross-sectional view of another aspect of a transistor according to the disclosure.

FIG. 8 shows a cross-sectional view of another aspect of a transistor according to the disclosure.

In particular, FIG. 8 a transistor 100 that may include one or more of the features of the disclosure. FIG. 8 further illustrates that the transistor 100 may include a field plate 132.

In one aspect, the field plate 132 may be arranged on the spacer layer 117 between the gate 114 and drain 112. In one aspect, the field plate 132 may be deposited on the spacer layer 117 between the gate 114 and the drain 112. In some aspects, the field plate 132 may be adjacent the gate 114 and an additional spacer layer 117 of dielectric material may be included at least partially over the gate 114 to isolate the gate 114 from the field plate 132. In some aspects, the field plate 132 may overlap the gate 114 and an additional spacer layer 117 of dielectric material may be included at least partially over the gate 114 to isolate the gate 114 from the field plate 132.

The field plate 132 may extend different distances from the edge of the gate 114, with a suitable range of distances being approximately 0.1 to 2 microns. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In one aspect, the field plate 132 may be formed on the spacer layer 117 between the gate 114 and the drain 112, with the field plate 132 being in proximity to the gate 114 but not overlapping the gate 114. In one aspect, a space between the gate 114 and field plate 132 may be wide enough to isolate the gate 114 from the field plate 132, while being small enough to maximize a field effect provided by the field plate 132.

In certain aspects, the field plate 132 may reduce a peak operating electric field in the transistor 100. In certain aspects, the field plate 132 may reduce the peak operating electric field in the transistor 100 and may increase the breakdown voltage of the transistor 100. In certain aspects, the field plate 132 may reduce the peak operating electric field in the transistor 100 and may reduce trapping in the transistor 100. In certain aspects, the field plate 132 may reduce the peak operating electric field in the transistor 100 and may reduce leakage currents in the transistor 100.

In aspects of the transistor 100 of the disclosure, the source 110 and the drain 112 may be symmetrical with respect to the gate 114. In some switch device application aspects, the source 110 and the drain 112 may be symmetrical with respect to the gate 114.

Figure 9:
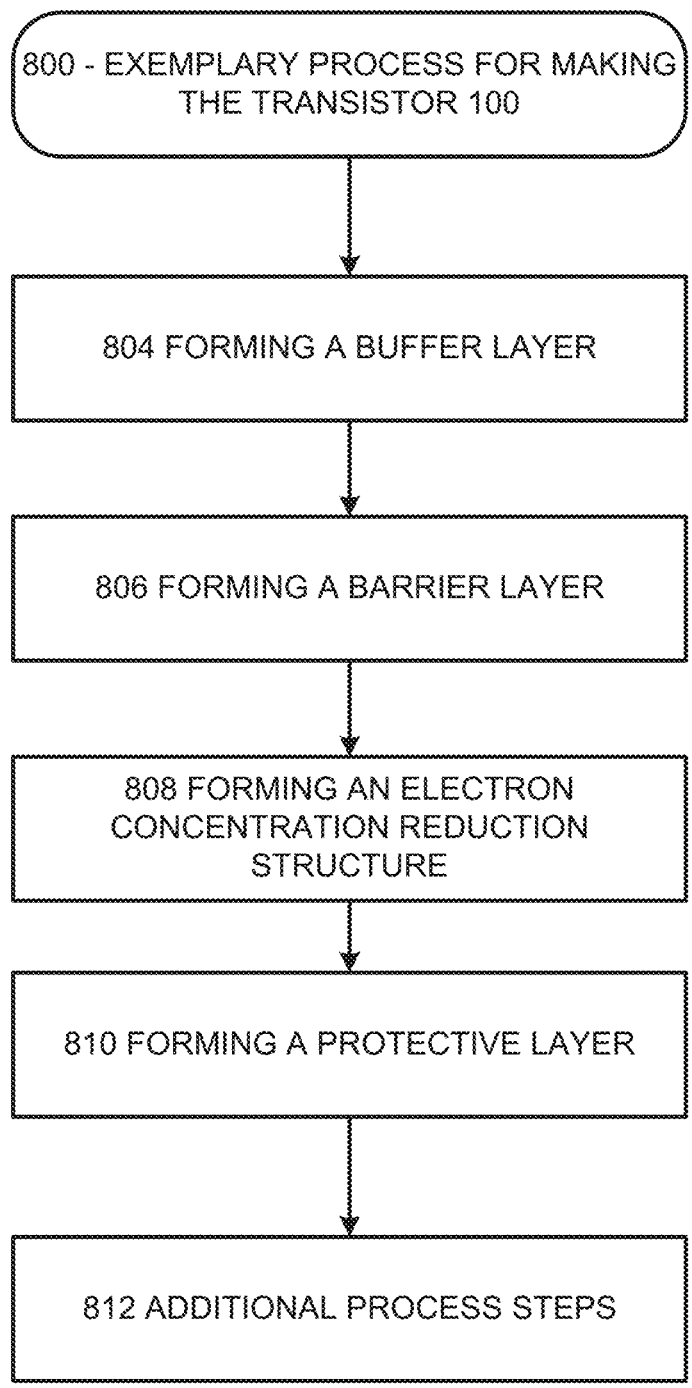
FIG. 9 shows a process for making a transistor according to the disclosure.

FIG. 9 shows a process for making a transistor according to the disclosure.

In particular, FIG. 9 shows an exemplary process 800 for making the transistor 100 of the disclosure. It should be noted that the process 800 is merely exemplary and may be modified consistent with the various aspects disclosed herein.

The process 800 may begin at step 802 by forming a substrate layer 102. The substrate layer 102 may be made of Silicon Carbide (SiC) or sapphire. In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. The substrate layer 102 may be formed of SiC selected from the group of 6H, 4H, 15R, 3C SiC, or the like. In another aspect, the substrate layer 102 may be GaAs, GaN, or other material suitable for the applications described herein. In another aspect, the substrate layer 102 may include spinel, ZnO, silicon, or any other material capable of supporting growth of Group III-nitride materials.

The buffer layer 104 may be formed at step 804 on the substrate layer 102. The buffer layer 104 may be grown or deposited on the substrate layer 102. In one aspect, the buffer layer 104 may be GaN. In another aspect, the buffer layer 104 may be formed with LEO. In one aspect, the nucleation layer 136 may be formed on the substrate layer 102 and the buffer layer 104 may be formed at step 806 on the nucleation layer 136. The buffer layer 104 may be grown or deposited on the nucleation layer 136. In one aspect, the buffer layer 104 may be GaN. In another aspect, the buffer layer 104 may be formed with LEO.

At step 806, the barrier layer 108 may be formed on the buffer layer 104. The barrier layer 108 may be an n-type conductivity layer or may be undoped. In one aspect, the barrier layer 108 may be AlGaN. In one aspect, the barrier layer 108 may be formed directly on the buffer layer 104. The barrier layer 108 may provide an additional layer between the buffer layer 104 and the source 110, the drain 112, and the gate 114. The barrier layer 108 may be AlGaN, AlN, a Group III-nitride, InAlGaN, or another suitable material. In one aspect, the barrier layer 108 may be AlGaN. In one aspect, the barrier layer 108 may be undoped. In one aspect, the barrier layer 108 may be doped. In one aspect, the barrier layer 108 may be an n-type material. In some aspects, the barrier layer 108 may have multiple layers of n-type material having different carrier concentrations. In one aspect, the barrier layer 108 may be a Group III-nitride or a combination thereof. In one aspect, a bandgap of the buffer layer 104 may be less than a bandgap of the barrier layer 108. In one aspect, a bandgap of the buffer layer 104 may be less than a bandgap of the barrier layer 108 to form a two-dimensional electron gas (2DEG) at a heterointerface 152 between the buffer layer 104 and barrier layer 108 when biased at an appropriate level. In one aspect, additional Group III-nitride layer(s) or region(s) and/or other layer(s) or region(s) of different materials are possible on the barrier layer 108 and/or in the overall structure. Any of the layers and/or regions can have uniform, non-uniform, graded and/or changing composition, thicknesses, and/or doping.

At step 808, the electron concentration reduction structure 199 may be formed. In one aspect, the electron concentration reduction structure 199 may be formed with one or more of the implanted portion 200, the first portion 300, the recessed portion 400, and/or the portion 500 consistent with the disclosure.

In one aspect, the implanted portion 200 may include implantation of P dopants. In one aspect, the implanted portion 200 may include implantation of fluorine. In one aspect, the implanted portion 200 may include implantation of negatively charged fluorine. In one aspect, the implanted portion 200 may include implantation of fluorine in the barrier layer 108. In one aspect, the implanted portion 200 may include implantation of fluorine ions. In one aspect, the implanted portion 200 may include implantation of negatively charged fluorine ions. In one aspect, the implanted portion 200 may include implantation of fluorine ions in the barrier layer 108. In one aspect, the barrier layer 108 may be an AlGaN barrier layer. In one aspect, the implanted portion 200 may include implantation of material to damage the barrier layer 108. In one aspect, the implanted portion 200 may include implantation of argon. In one aspect, the implanted portion 200 may include implantation of argon in the barrier layer 108 to damage the barrier layer 108. In one aspect, the implanted portion 200 may include implantation of ions to damage the barrier layer 108. In one aspect, the implanted portion 200 may include implantation of argon ions. In one aspect, the implanted portion 200 may include implantation of argon ions in the barrier layer 108 to damage the barrier layer 108. In one aspect, the barrier layer 108 may be an AlGaN barrier layer. In one aspect, the implanted portion 200 may have a uniform, non-uniform and/or changing distribution of implants.

In one aspect, prior to formation of the first portion 300, the barrier layer 108 may be etched down to the buffer layer 104 to form a recess 310. Thereafter, the first portion 300 may be regrown in the recess 310. In one aspect, the first portion 300 may include the same material as the barrier layer 108. In one aspect, the first portion 300 may include a different material than the barrier layer 108. In one aspect, the first portion 300 may include a Group III-nitride material, such as AlGaN that is regrown and may have the same composition as the barrier layer 108. In one aspect, the first portion 300 may include a Group III-nitride material, such as AlGaN that is regrown and may have a different composition of AlGaN as the barrier layer 108. In some aspects, the first portion 300 can extend uniformly, non-uniformly and/or changing fashion with respect to composition, doping and/or thickness.

In one aspect, prior to formation of the recessed portion 400, the barrier layer 108 may be etched to form a recess 410. Thereafter, the recessed portion 400 may be formed. In one aspect, be recessed portion 400 may be a protective layer. In one aspect, the recessed portion 400 may be a protective layer having the same composition as the protective layer 116. In one aspect, the recessed portion 400 may be the protective layer 116. In some aspects, the recessed portion 400 may be uniform and/or non-uniform in shape and/or thickness. In some aspects, the recessed portion 400 can be a void, filled or partially filled with a material or different materials, such as dielectric or insulating material(s). In one aspect, the recess portion 400 such materials are made of a single or multiple layer(s) and/or regions. In some aspects, the filled material may be of uniform, non-uniform, or changing composition.

In one aspect, the portion 500 may be Group III-nitride, such as GaN. In one aspect, the portion 500 may be P—GaN. In one aspect, the portion 500 may be P—GaN having a concentration of P dopant in a range of 0.5 e12/cm2 to 2 e12/cm2, 0.8 e12/cm2 to 1.2 e12/cm2, 1.2 e12/cm2 to 2 e12/cm2. In one aspect, the P dopants may include zinc, iron, carbon, magnesium, and the like. In other aspects, the portion 500 may include different materials, different P dopant concentrations, and different P dopants. In one aspect, the portion 500 may be grown by epitaxial growth. In one aspect, the portion 500 may be grown by epitaxial growth over an entire length of the barrier layer 108 and selectively removed.

At step 810, the protective layer 116 may be formed. The protective layer 116 may be a passivation layer, such as SiN, AlO, SiO, $SiO_2$, AlN, or the like, or a combination incorporating multiple layers thereof, which may be deposited over the exposed surface of the barrier layer 108 and/or the electron concentration reduction structure 199.

Further during the process 800, additional process steps 812 may be performed. For example, the source 110 may be arranged on the barrier layer 108. The source 110 may be an ohmic contact of a suitable material that may be annealed. For example, the source 110 may be annealed at a temperature of from about 500° C. to about 800° C. for about 2 minutes. However, other times and temperatures may also be utilized. Times from about 30 seconds to about 10 minutes may be, for example, acceptable. In some aspects, the source 110 may include Al, Ti, Si, Ni, and/or Pt. In one aspect, a region under the source 110 that is an N+ material may be formed in the barrier layer 108. In one aspect, a region under the drain 112 may be Si doped.

Further during the process 812, the drain 112 may be arranged on the barrier layer 108. Like the source 110, the drain 112 may be may be an ohmic contact of Ni or another suitable material, and may also be annealed in a similar fashion. In one aspect, an n+ implant may be used in conjunction with the barrier layer 108 and the contacts are made to the implant. In one aspect, a region under the drain 112 that is an N+ material may be formed in the barrier layer 108. In one aspect, a region under the drain 112 may be Si doped.

Further during the process 812, the gate 114 may be arranged on the barrier layer 108 between the source 110 and the drain 112. A layer of Ni, Pt, AU, or the like may be formed for the gate 114 by evaporative deposition or another technique. The gate structure may then be completed by deposition of Pt and Au, or other suitable materials. In some aspects, the contacts of the gate 114 may include Al, Ti, Si, Ni, and/or Pt.

The source 110 and the drain 112 electrodes may be formed making ohmic contacts such that an electric current flows between the source 110 and drain 112 electrodes via a two-dimensional electron gas (2DEG) induced at the heterointerface 152 between the buffer layer 104 and barrier layer 108 when a gate 114 electrode is biased at an appropriate level. In one aspect, the heterointerface 152 may be in the range of 0.005 µm to 0.007 µm, 0.007 µm to 0.009 µm, and 0.009 µm to 0.011 µm.

The gate 114 may extend on top of a spacer or the protective layer 116. The protective layer 116 may be etched and the gate 114 deposited such that the bottom of the gate 114 is on the surface of barrier layer 108. The metal forming the gate 114 may be patterned to extend across protective layer 116 so that the top of the gate 114 forms a field plate 132.

Further during some aspects of the process 812, the field plate 132 may be arranged on top of another protective layer and may be separated from the gate 114. In one aspect, the field plate 132 may be deposited on the spacer layer 117 between the gate 114 and the drain 112. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like. In one aspect, a plurality of the field plates 132 may be used. In one aspect, a plurality of the field plates 132 may be used and each of the plurality of field plates 132 may be stacked with a dielectric material therebetween. In one aspect, the field plate 132 extends toward the edge of gate 114 towards the drain 112. In one aspect, the field plate 132 extends towards the source 110. In one aspect, the field plate 132 extends towards the drain 112 and towards the source 110. In another aspect, the field plate 132 does not extend toward the edge of gate 114. Finally, the structure may be covered with a dielectric spacer layer 117 such as silicon nitride. The dielectric spacer layer 117 may also be implemented similar to the protective layer 116. Moreover, it should be noted that the cross-sectional shape of the gate 114, shown in the Figures is exemplary. For example, the cross-sectional shape of the gate 114 in some aspects may not include the T-shaped extensions. Other constructions of the gate 114 may be utilized.

It should be noted that the steps of process 800 may be performed in a different order consistent with the aspects described above. Moreover, the process 800 may be modified to have more or fewer process steps consistent with the various aspects disclosed herein.

Figure 10:
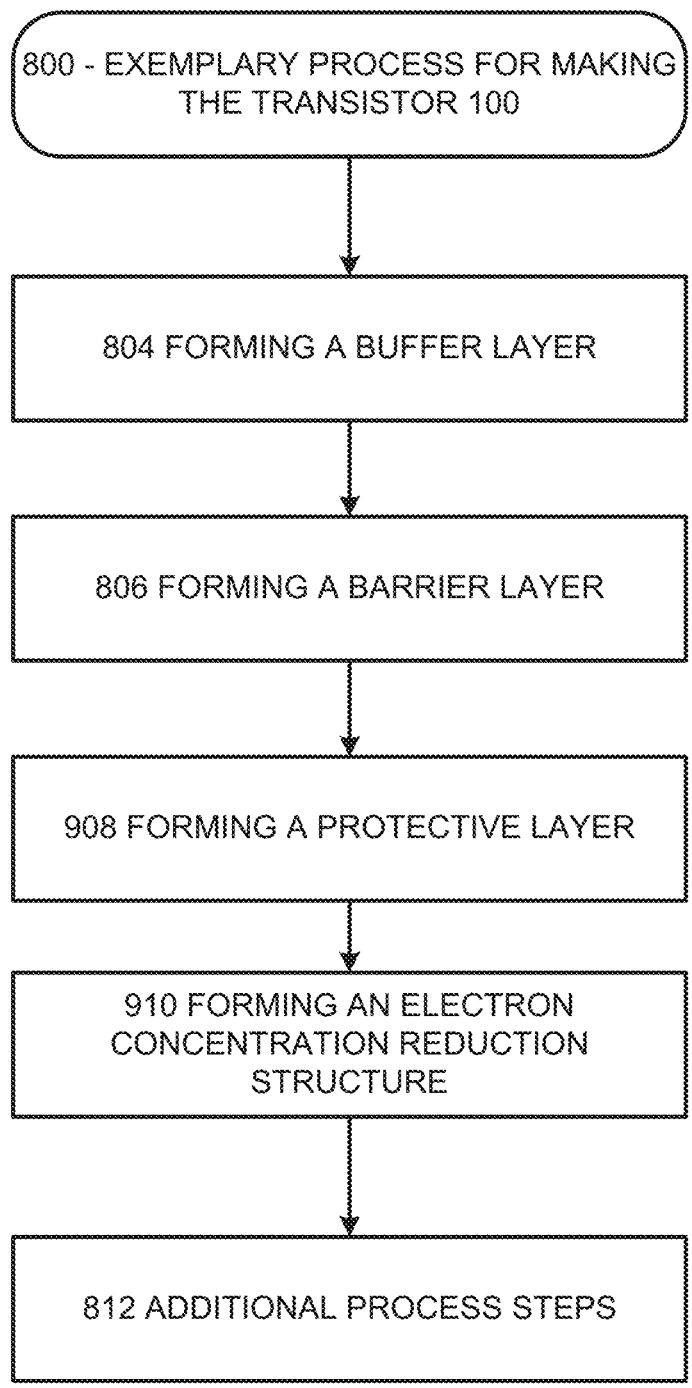
FIG. 10 shows a process for making a transistor according to the disclosure.

FIG. 10 shows a process for making a transistor according to the disclosure.

In particular, FIG. 10 illustrates the process 800 consistent with FIG. 9 with the modification of step 908 and step 910. After steps 802, 804, and 806 are performed as described above, step 908 may be performed. At step 908, the protective layer 116 may be formed. The protective layer 116 may be a passivation layer, such as SiN, AlO, SiO, $SiO_2$, AlN, or the like, or a combination incorporating multiple layers thereof, which may be deposited over the exposed surface of the barrier layer 108.

At step 910, the electron concentration reduction structure 199 may be formed. In one aspect, a recess for the electron concentration reduction structure 199 may be formed in the protective layer 116. Thereafter, the electron concentration reduction structure 199 may be formed. In one aspect, the electron concentration reduction structure 199 may be formed with one or more of the implanted portion 200, the first portion 300, the recessed portion 400, and/or the portion 500 consistent with the disclosure. Each of these aspects of the electron concentration reduction structure 199 are described above in detail. Thereafter, an additional protective layer may be formed on the electron concentration reduction structure 199. The additional protective layer may be a passivation layer, such as SiN, AlO, SiO, $SiO_2$, AlN, or the like, or a combination incorporating multiple layers thereof, which may be deposited over the exposed surface of the barrier layer 108 and/or the electron concentration reduction structure 199. Thereafter, the process 800 may perform the steps consistent with step 812 as described above.

It should be noted that the steps of process 800 may be performed in a different order consistent with the aspects described above. Moreover, the process 800 may be modified to have more or fewer process steps consistent with the various aspects disclosed herein.

Figure 11:
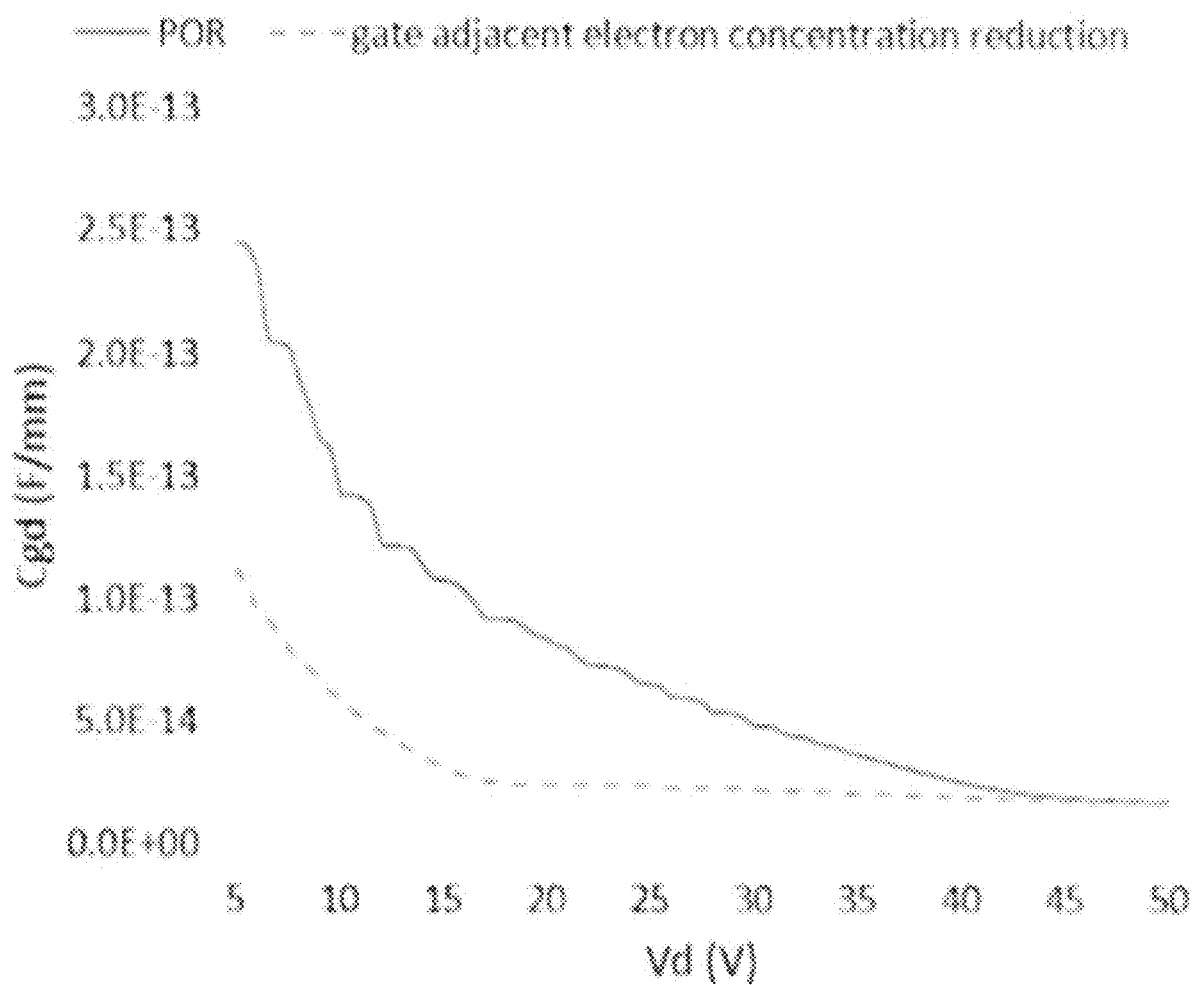
FIG. 11 shows a simulated comparison between a prior art transistor and a transistor according to the disclosure.

FIG. 11 shows a simulated comparison between a prior art transistor and a transistor according to the disclosure.

In particular, FIG. 11 is a comparison of simulated gate-drain capacitance (Cgd) between a prior art transistor (POR) and the transistor 100 of the disclosure implementing the first aspect of the disclosure. The Y-axis references the gate-drain capacitance (Cgd) in units of farad per millimeter (F/mm) and the X-axis references the voltage at the drain (Vd) in units of volts (V).

In particular, FIG. 11 illustrates that the transistor 100 of the disclosure implementing the first aspect of the disclosure shows a Cgd reduction of approximately 50% at lower voltage values at the drain (Vd). Accordingly, FIG. 11 illustrates the unexpected results of implementing the electron concentration reduction structure 199 in reducing the electron concentration in the gate adjacent area, resulting in drop of gate-drain capacitance and improvement of power gain and efficiency. Although these simulated results are with respect the transistor 100 of the disclosure implementing the first aspect of the disclosure, the other aspects of the transistor 100 should similarly provide similar results.

Accordingly, the disclosure has set forth a transistor 100 having an electron concentration reduction structure 199 that may reduce electron concentration around the gate 114, may reduce electron concentration around an edge of the gate 114, may reduce electron concentration, may increase power gain, may increase efficiency, may decouple the gate 114 from the drain 112, may decouple the gate 114 from the source 110, may reduce electron gas concentration, may reduce capacitance, and the like. Additionally, as described herein, the electron concentration reduction structure 199 may be utilized in a Gallium Nitride (GaN) based high-electron mobility transistors (HEMTs). However, the disclosure is not limited to this particular application of the electron concentration reduction structure 199. The electron concentration reduction structure 199 may be utilized in other similar micro-electronic devices with similar operational improvements.

In particular aspects, the transistor 100 of the disclosure may be utilized in amplifiers. In further aspects, the transistor 100 of the disclosure may be utilized in amplifiers implemented by wireless base stations that connect to a wireless device. In further aspects, the transistor 100 of the disclosure may be utilized in amplifiers implemented in wireless devices.

In this disclosure it is to be understood that reference to a wireless device is intended to encompass electronic devices such as mobile phones, tablet computers, gaming systems, MP3 players, personal computers, PDAs, and the like. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A transistor device comprising:
   a substrate;
   a buffer layer on the substrate;
   a barrier layer on the buffer layer;
   a source electrically coupled to the barrier layer;
   a gate arranged on the barrier layer;
   a drain electrically coupled to the barrier layer; and
   an electron concentration reduction structure located and between the gate and the drain in a gate-drain region of the transistor device and the electron concentration reduction structure being at least one of the following: arranged in the barrier layer and arranged on the barrier layer,
   wherein the electron concentration reduction structure is configured to at least one of the following: reduce electron concentration around the gate, reduce electron concentration around an edge of the gate, reduce electron concentration, increase power gain, increase efficiency, decouple the gate from the drain, decouple the gate from the source, and reduce capacitance; and
   wherein the electron concentration reduction structure comprises at least one of the following: an implantation portion arranged in the barrier layer between the gate and the drain, an etched-regrown portion arranged in a recess of the barrier layer, and an additional portion arranged on the barrier layer between the gate and the drain.

2. The transistor device according to claim 1 wherein the electron concentration reduction structure comprises at least one of the following: the implantation portion arranged in the barrier layer adjacent and between the gate and the drain, the etched-regrown portion arranged in a recess of the barrier layer adjacent and between the gate and the drain, and the additional portion arranged on the barrier layer adjacent and between the gate and the drain.

3. The transistor device according to claim 1
wherein the electron concentration reduction structure comprises the implantation portion arranged between the gate and the drain in the barrier layer; and
wherein the implantation portion is structured by implantation of P dopants.

4. The transistor device according to claim 1
wherein the electron concentration reduction structure comprises the implantation portion arranged between the gate and the drain in the barrier layer; and
wherein the implantation portion in the barrier layer comprises at least one of the following: implantation of fluorine dopants in the barrier layer and implantation of material to damage the barrier layer.

5. A transistor device comprising:
a substrate;
a buffer layer on the substrate;
a barrier layer on the buffer layer,
a source electrically coupled to the barrier layer;
a gate arranged on the barrier layer;
a drain electrically coupled to the barrier layer; and
an electron concentration reduction structure located horizontally between the gate and the drain in a gate-drain region of the transistor device and the electron concentration reduction structure being at least one of the following: arranged in the barrier layer and arranged on the barrier layer,
wherein the electron concentration reduction structure is configured to at least one of the following: reduce electron concentration around the gate, reduce electron concentration around an edge of the gate, reduce electron concentration, increase power gain, increase efficiency, decouple the gate from the drain, decouple the gate from the source, and reduce capacitance; and
wherein the electron concentration reduction structure comprises an etched-regrown portion in the barrier layer.

6. The transistor device according to claim 5 wherein the electron concentration reduction structure comprises the etched-regrown portion that comprises a first portion arranged in a recess in the barrier layer and a second portion of regrown material located on the first portion arranged in the recess.

7. The transistor device according to claim 1 wherein the electron concentration reduction structure comprises the etched-regrown portion in the barrier layer.

8. The transistor device according to claim 7 wherein the etched-regrown portion comprises a first portion arranged in a recess in the barrier layer and a second portion of regrown material located on the first portion arranged in the recess.

9. The transistor device according to claim 1 wherein the electron concentration reduction structure comprises the additional portion arranged on the barrier layer.

10. The transistor device according to claim 9
wherein the additional portion is arranged on a top surface of the barrier layer; and
wherein the additional portion is arranged adjacent a protective layer arranged on the barrier layer.

11. A process of forming a transistor device comprising:
providing a substrate;
arranging a buffer layer on the substrate;
arranging a barrier layer on the buffer layer,
electrically coupling a source to the barrier layer;
arranging a gate on the barrier layer;
electrically coupling a drain to the barrier layer; and
forming an electron concentration reduction structure located and between the gate and the drain in a gate-drain region of the transistor device and being at least one of the following: arranged in the barrier layer and arranged on the barrier layer,
wherein the electron concentration reduction structure is configured to at least one of the following: reduce electron concentration around the gate, reduce electron concentration around an edge of the gate, reduce electron concentration, increase power gain, increase efficiency, decouple the gate from the drain, decouple the gate from the source, and reduce capacitance; and
wherein the electron concentration reduction structure comprises at least one of the following: an implantation portion arranged in the barrier layer between the gate and the drain, an etched-regrown portion arranged in a recess of the barrier layer, and an additional portion arranged on the barrier layer between the gate and the drain.

12. The process of forming the transistor device according to claim 11 wherein the electron concentration reduction structure comprises at least one of the following: the implantation portion arranged in the barrier layer adjacent and between the gate and the drain, the etched-regrown portion arranged in a recess of the barrier layer adjacent and between the gate and the drain, and the additional portion arranged on the barrier layer adjacent and between the gate and the drain.

13. The process of forming the transistor device according to claim 11
wherein the electron concentration reduction structure comprises the implantation portion arranged between the gate and the drain in the barrier layer; and
wherein the implantation portion is structured by implantation of P dopants.

14. The process of forming the transistor device according to claim 11
wherein the electron concentration reduction structure comprises the implantation portion arranged between the gate and the drain in the barrier layer; and
wherein the implantation portion in the barrier layer comprises at least one of the following: implantation of fluorine dopants in the barrier layer and implantation of material to damage the barrier layer.

15. The process of forming the transistor device according to claim 11 wherein the electron concentration reduction structure comprises the etched-regrown portion in the barrier layer that comprises a first portion arranged in a recess in the barrier layer and a second portion of regrown material located on the first portion arranged in the recess.

16. The process of forming the transistor device according to claim 11 wherein the electron concentration reduction structure comprises a first portion arranged in a recess in the barrier layer and a second portion of regrown material located on the first portion arranged in the recess.

17. The process of forming the transistor device according to claim 11 wherein the electron concentration reduction structure is arranged in a recess in the barrier layer.

18. The process of forming the transistor device according to claim 17 wherein the electron concentration reduction structure comprises a recess in a top surface of the barrier layer.

19. The process of forming the transistor device according to claim 11
wherein the electron concentration reduction structure comprises the additional portion arranged on the barrier layer; and
wherein the additional portion is arranged adjacent a protective layer arranged on the barrier layer.

20. The process of forming the transistor device according to claim 19 wherein the additional portion is arranged on a top surface of the barrier layer; and
wherein the additional portion comprises gallium nitride (GaN).

\* \* \* \* \*